(12) United States Patent
Bilger

(10) Patent No.: US 7,151,663 B2
(45) Date of Patent: Dec. 19, 2006

(54) ATTACHMENT AND CONTACTING OF A METAL HOUSING OF A DISPLAY

(75) Inventor: Markus Bilger, Trossingen (DE)

(73) Assignee: Siemens AG, München (DE)

( * ) Notice: Subject to any disclaimer, the term of this patent is extended or adjusted under 35 U.S.C. 154(b) by 117 days.

(21) Appl. No.: 10/883,685

(22) Filed: Jul. 6, 2004

(65) Prior Publication Data
US 2005/0024817 A1 Feb. 3, 2005

(30) Foreign Application Priority Data
Jul. 15, 2003 (EP) ................... 03016059

(51) Int. Cl.
*H05K 7/20* (2006.01)
(52) U.S. Cl. ............ 361/681; 361/679; 349/149; 349/151; 349/152
(58) Field of Classification Search .............. 361/681, 361/682, 816, 818, 749, 770, 783, 785; 29/830, 29/832, 854, 836; 349/58, 59, 62, 61, 60, 349/110, 138, 149, 150, 151, 152; 174/35 R, 174/36; 348/794
See application file for complete search history.

(56) References Cited

U.S. PATENT DOCUMENTS

| | | | | |
|---|---|---|---|---|
| 5,166,815 A | * | 11/1992 | Elderfield | 349/64 |
| 5,358,412 A | * | 10/1994 | Maurinus et al. | 439/66 |
| 5,666,172 A | | 9/1997 | Toshiba | |
| 5,675,397 A | * | 10/1997 | Fukushima | 349/149 |
| 6,542,213 B1 | * | 4/2003 | Uchiyama | 349/149 |
| 6,675,470 B1 | * | 1/2004 | Muramatsu | 29/832 |

FOREIGN PATENT DOCUMENTS

| | | |
|---|---|---|
| JP | 01118818 | 5/1989 |
| JP | 2002091325 | 3/2002 |

OTHER PUBLICATIONS

Abstract—JP-Publication No. 01118818/Application No. 62275864; May 11, 1989; Canon, Inc., Japan.
Abstract—JP-Publication No. 2002091325/Application No. 2000281952; Mar. 27, 2002; Tottori Sanyo Electric Co. Ltd., Japan.

* cited by examiner

*Primary Examiner*—Michael Datskovskiy
(74) *Attorney, Agent, or Firm*—Siemens AG

(57) ABSTRACT

The present invention relates to a housing assembly and method of making it. The housing assembly may be used for housing electronic apparatus requiring protection from external corrosive forces including blunt shocks, humidity and so forth. The present housing makes use of the printed circuit board, normally employed for operating electronic apparatus, as a top. The remaining components are assembled, inserted into the housing and held down in place. The housing is then accommodated from the sides while top portions of housing side walls are bent towards one another so as to extend towards one another. Spacers are included as part of the above assembly and are appropriately inserted and placed so as to form a counter force to the now downturned top portions of the housing side walls. Accordingly, the printed circuit board is now held in place by the cooperation of the spacers and top portions. The prior need for rigid legs attached to the circuit board during assembly and introduced during insertion is obviated.

10 Claims, 8 Drawing Sheets

ATTACHMENT AND CONTACTING OF A METAL HOUSING OF A DISPLAY

BACKGROUND OF THE INVENTION

The present invention relates to housings for electrical assemblies and more particularly to a method of assembling an electrical apparatus in a housing and the system it produces. Assembly of electrical apparatus must be performed with great care given the sensitive components and connections involved. The housings on the other hand must be robust in order to offer its components protection from physical as well as environmental effects. Accordingly, housings comprise robust materials, such as metals. The metal must be handled with care around the electrical apparatus and associated components so as not to damage the latter with the former. The housing may further share surfaces with components to be accommodated therein. Accordingly, a housing top may also comprise the printed circuit board which facilitates operation of the electrical apparatus accompanied within the housing. The present invention will be discussed, by way of example, as a housing of the latter type or cap. Herein, the cap will be discussed with respect to a display device to be housed substantially therein. However, the present invention is not limited to caps and display devices and may find other application and utility as envisioned by one skilled in the art.

Caps are known to comprise a frame in which sits components whose protection from external sources is sought. Accordingly, caps tend to be made of rigid material formed into a functionally useful shape—such as a rectangular housing. The housing generally comprises a base with a portion removed leaving a border to define a display area. Behind the display area in the direction of the housing generally sits the display portion of the electrical apparatus which the cap will house. Such display portions may include a liquid crystal display (LCD) screen optionally with a diffuser and/or prism arranged as known in the art. Accordingly, the LCD screen is visible from outside the cap.

The cap includes at least a pair of side walls spanning from the base to a top portion. The side walls may include openings through which connections to apparatus accommodated within the cap may be facilitated. The cap may not necessarily include a top. Rather with some constructions, the printed circuit board, required for operation of the apparatus accommodated within the cap may substitute or function as the top. This has the obvious advantage of requiring fewer parts making for an easier and lighter assembly as well as access to the board. However, this advantage has the problem that during assembly, an appropriate spacing between board and components of the apparatus accommodated within the cap must be maintained. In particular, the board must be properly supported so as to offer the relatively same protection to the components and apparatus accommodated within the cap as the cap side walls and base.

A solution to the aforementioned problem includes affixing spacing legs onto the board during assembly. The legs are made of a sufficiently rigid material so as to provide sufficient support and/or the transfer of supported force from a rigid supporting surface. The legs have a select length that corresponds to a length of the cap side walls. The legs length positions the cap at a select distance above the base, the distance being sufficient to suitably accommodate the electrical apparatus and components thereof between base and board. The legs are typically bolted or screwed onto the board. Afterwards, electrical connections are effected between board and components of the apparatus. This is typically performed by use of ribbon cables and the like. Then the components and board with legs are inserted into the cap or the cap is placed over the components and board and the board is secured into place.

The above solution includes problems stemming from use of the legs. The legs are of a sufficiently rigid material so as to impart support from the base to the board. The rigid legs however, also tend to cause damage to the components and electrical apparatus when the legs come into contact. Given the limited space within a cap, the assembly tolerances are such that contact is inevitable absent particular caution and care. Damage from the contact is not limited to component or apparatus, but may also include damage to connections, especially ribbon connections. Accordingly, a need exists for an assembly which when assembled does not cause the aforementioned damage to components, apparatus nor connections. In addition, an on-going need exists in balancing the need to maximize the space within the cap while at the same time maximizing available assembly tolerances.

SUMMARY OF THE INVENTION

An object and advantage of the present invention is to provide a novel housing for an electronic apparatus which includes making use of the PCB as a top and bending over top portions of the side walls so that they extend towards one another. The step of bending is preceded by exerting downward pressure on an assembly which includes the PCB as its top, the assembly being located within the housing. The present invention provides a novel method of assembling the above described housing.

The present invention has the advantage of facilitating an assembly of an electrical apparatus with components in a cap without use of the above legs. Without the legs, potential damage to the apparatus and components is eliminated.

Likewise, the usable space within the cap is increased along with assembly tolerances.

These and other advantages are achieved by use of a frame with spacers in place of the aforementioned legs. The spacers comprise a pliable substance of sufficient strength to impart support to the board from the base. The frame facilitates accommodation of the spacers along with components within the cap. The frame itself may also include elements which provide guidance and/or support to the board. The invention also includes a novel manufacturing method. The method includes assembling the components together with the board prior to insertion, locating the assembly within the cap, applying a downward pressure, folding over overhanging portions of the side walls so as to accommodate the board between the overhangs and the spacers. In addition, the side walls and base are supported so that the force used to fold the overhangs is localized rather than distributed throughout the cap and/or it's interior. Likewise, the downward pressure has the advantage of holding the assembly in place and order while the overhangs are folded. Further advantages of the present invention are set out in the dependent claims.

BRIEF DESCRIPTION OF THE SEVERAL VIEWS OF THE DRAWINGS

These and further aspects and advantages of the invention will be discussed more in detail hereinafter with reference to the disclosure of preferred embodiments, and in particular with reference to the appended Figures that show.

DETAILED DESCRIPTION OF THE INVENTION

Figure 1:
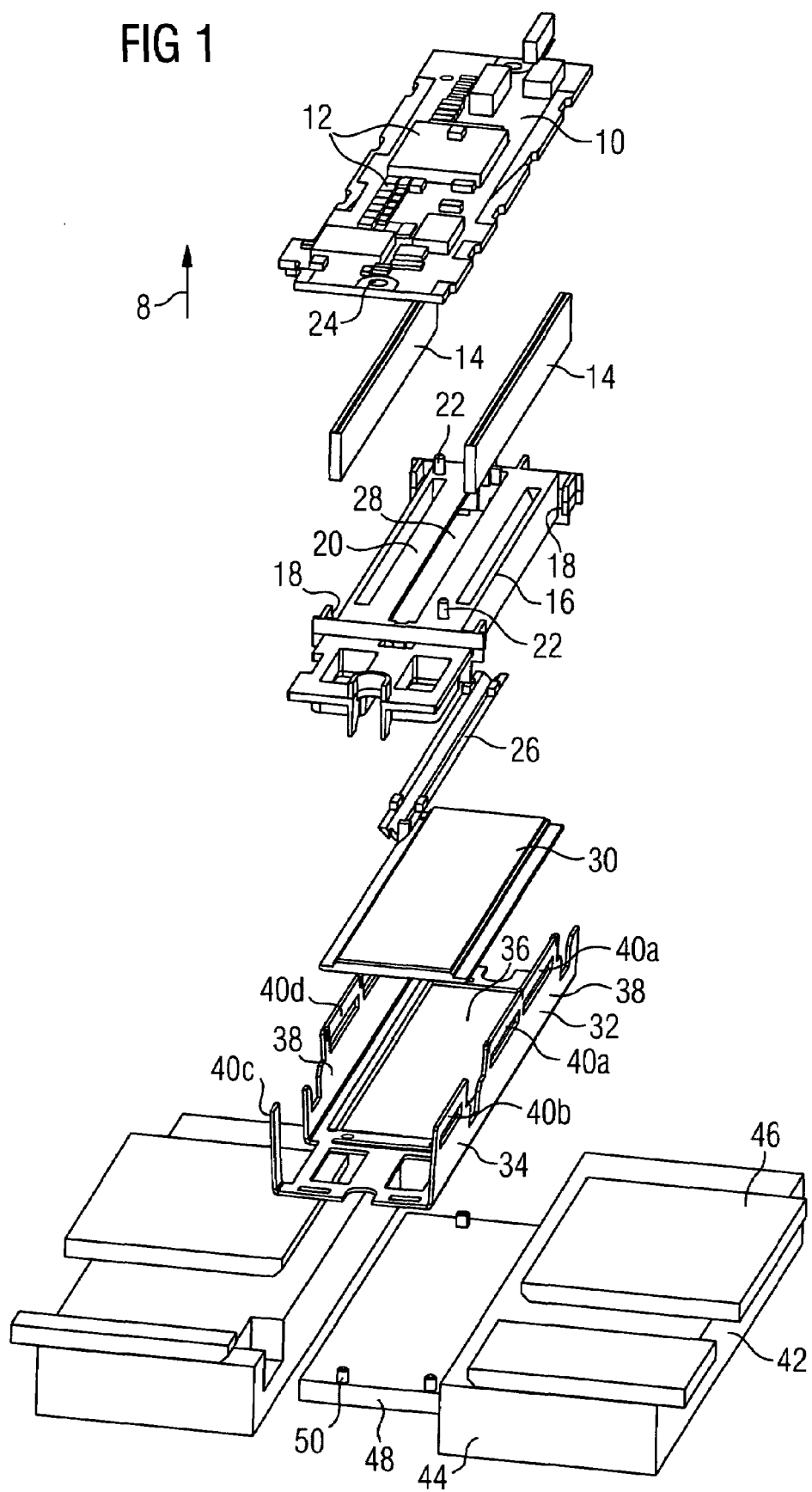
FIG. 1 depicts an exploded view of a first assembly embodiment.

Throughout the specification, like reference numerals refer to equivalent elements. FIG. 1 depicts an exploded view of an assembly according to a first embodiment of the present invention. As shown, the assembly comprises a printed circuit board PCB hereinafter abbreviated as PCB. The PCB is shown with a plurality of electrical components 12 attached thereto. The number and type of component and board along with the assembly thereof are known in the art. Components 12 are depicted attached on top of PCB, the upwards direction being indicated by arrow 8. Below PCB are two spacers 14. The spacers 14 may comprise a pliable material that is sufficiently stable so as to impart support to the PCB while absorbing a downward force from the PCB. One such material includes rubber. The spacers are depicted as elongated rectangles, but may be made to any shape and of any material sufficient to accomplish its function set out below. Different numbers of spacers 14, shapes and/or materials therefore may be required depending upon application. The spacers 14 are accommodated within frame 16 depicted below spacers 14. In particular, the spacers 14 are accommodated in tracks 18. The frame is made of a suitably rigid material that provides support for the spacers 18 and PCB. When assembled, the PCB rests on an upper relatively flat surface 20 of frame 16. Surface 20 includes a pair of stubs 22 extending in an upward direction. The number, shape and design of the stubs 22 is a matter of design choice. The stubs 22 are of sufficient strength so as to provide guidance and lateral support for PCB when the PCB comes into contact with and rests upon surface 20. Stubs 22 are positioned to mate with suitable shaped accommodated holes 24 in PCB.

The present invention is directed to a housing for an electronic apparatus. The present embodiment is discussed with respect to that apparatus being one of a display apparatus. Selection and implementation of an electronic apparatus with the present invention is a matter of design choice. Other electronic apparatus may include detector elements. Depicted below frame 16 is prism 26. Frame 16 is fabricated so as to accommodate prism 26 within opening 28. The prism operates in cooperation with PCB and liquid crystal display screen 30, hereinafter abbreviated as LCD, to produce a display. The LCD screen may include a diffuser. LCD rests in a cap 32. Cap 32 includes a base 34 having an opening 36 therein. The LCD is such that it displays in a downward direction through opening 36. The LCD is accordingly positioned in cap 32 on base 34. Cap 32 further includes a pair of opposing side walls 38. Side walls 38 include flanges 40 along its upper surface. In FIG. 1, four flanges 40a–40d are depicted.

A fastening device 42 is depicted below cap 32. The fastening device 54 includes a first holding member 44 for accommodating the cap and side walls in particular therebetween; and a second holding member 46 for folding the flanges in a direction towards one another. The cap 32 rests upon platform 48. The platform may also include upwardly protruding stubs 50 whose number, composition and location are a matter of design choice. As depicted, stubs 50 are used to accommodate and position cap 32 on platform 48. The assembly of the above described apparatus will not be discussed with respect to the instant method beginning on FIG. 2.

A first step is indicated by reference number 52. As shown, cap 32 is positioned between first holding members 44 and on platform 48. The above mentioned components: PCB, spacers 14, etc. are assembled as depicted in FIG. 1 and placed into cap 32. Electrical connections and the like are not shown for simplicity purposes. The side walls 38 of cap 32 slightly flex in a lateral direction away from the aforementioned components. The side walls further include side protrusions 54 to facilitate handling by first holding member 44. A downward pressure (arrow 60) is applied to the components within the cap and the PCB in particular. The downward pressure is sufficient so as to keep the components in place and order while not damaging any of them. The downward pressure is somewhat absorbed by spacers 14. The downward pressure is provided by means known to one skilled in the art.

A second step is indicated by reference number 56. As shown, the first holding members 44 are moved inwardly, in a direction towards one another, and engaged side walls 38. The first holding members urge the side walls inwards, in a direction towards one another and further provide support for the side walls, components therebetween and cap in general. As depicted, the side walls now appear relatively perpendicular abutting PCB and spacers 14.

A third step is indicated by reference number 58. As shown, the second holding members 46 are moved inwardly so as to engage flanges 40 (40a–40d in particular). A fourth step, indicated by number 62, depicts flanges 40 being bent over PCB in a direction towards one another. By the bending action, the flanges 40 now provide the downward pressure previously indicated by arrow 60. Accordingly, the downward pressure is now halted. The components within the cap are now held in place by the downward pressure from flanges 40, imparted to the components via PCB and countered by resistant pressure from spacers 14. A fifth step is indicated by reference number 64. As shown, the first and second holding members (44, 46) are backed away from cap 32 which now stands compacted and secured as a final product, in this case a display unit.

Figure 2:
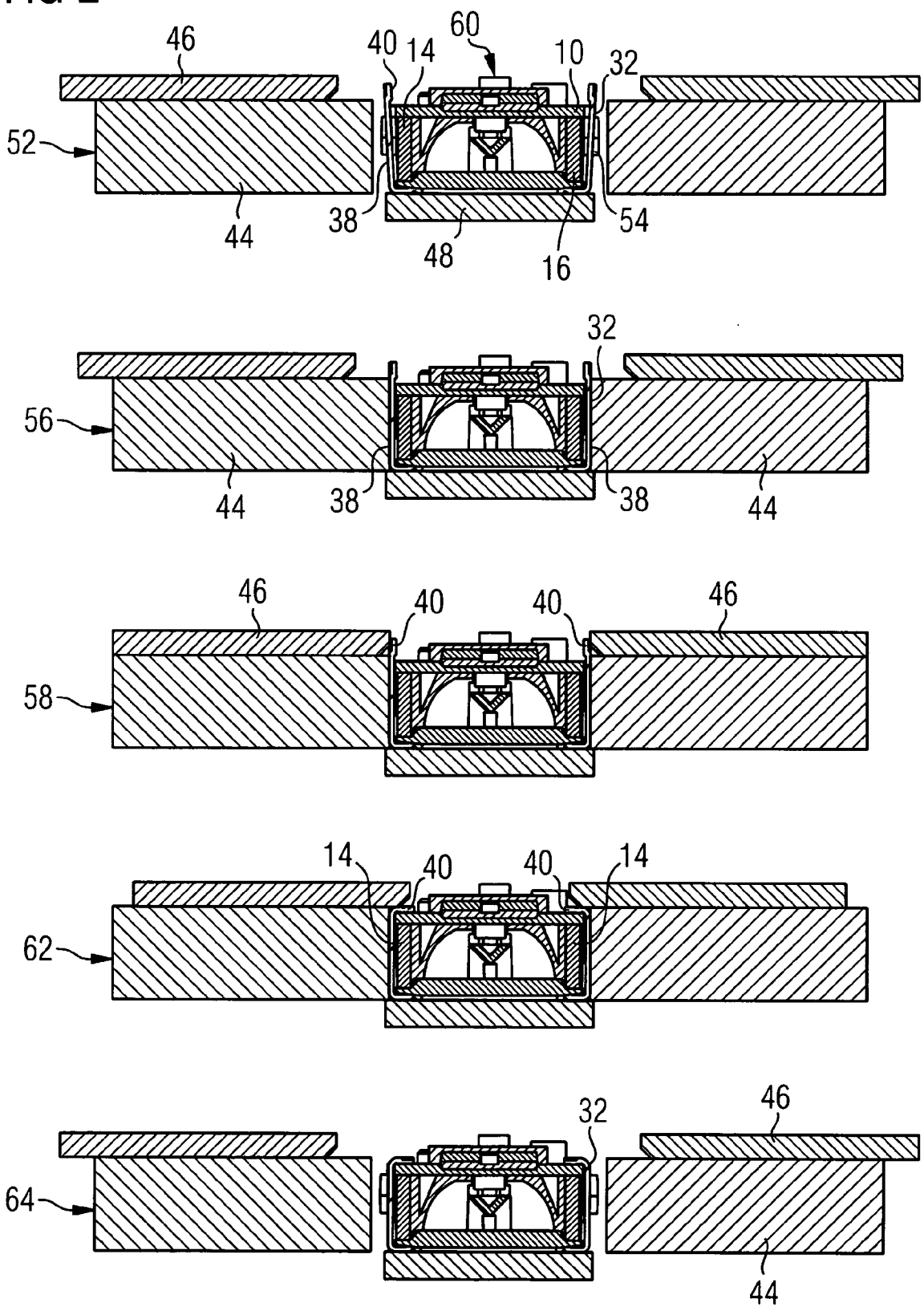
FIG. 2 depicts a series of method steps according to a first method embodiment.
Figure 3:
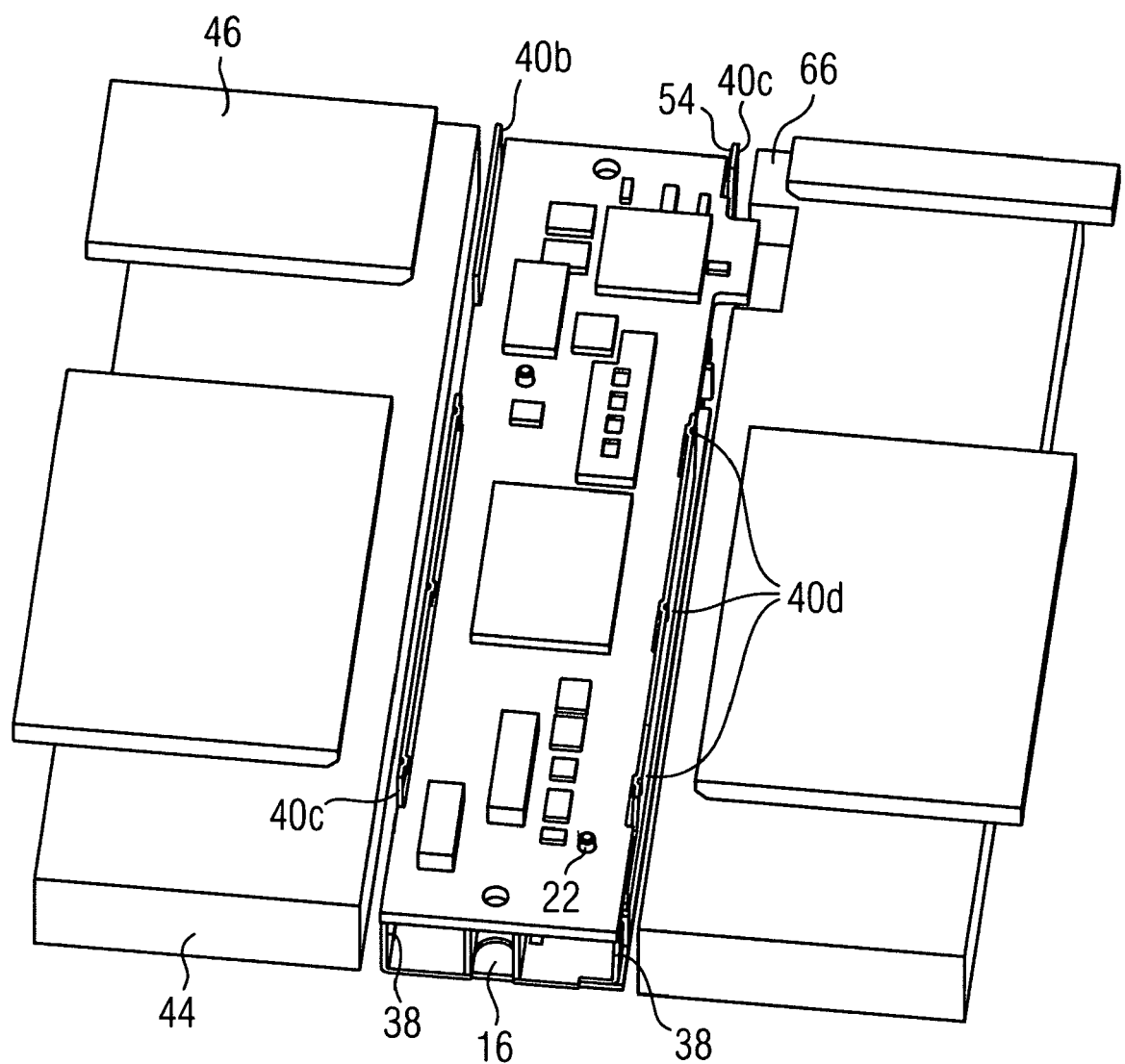
FIG. 3 depicts a first of the method steps of FIG. 2.

FIGS. 3–7 depict a top orthogonal view of the method steps depicted in FIG. 2. FIG. 3 depicts the first holding members 44 approaching side walls 38. Flanges 40a–40d are depicted extending above the first holding members 44. PCB is depicted with stubs 22 extending therethrough. In addition, portions of frame 16 are viewed from the bottom of the figure and side protrusion 54 may be viewed engaging a suitable mating means 66 in one of the first holding members 44.

Figure 4:
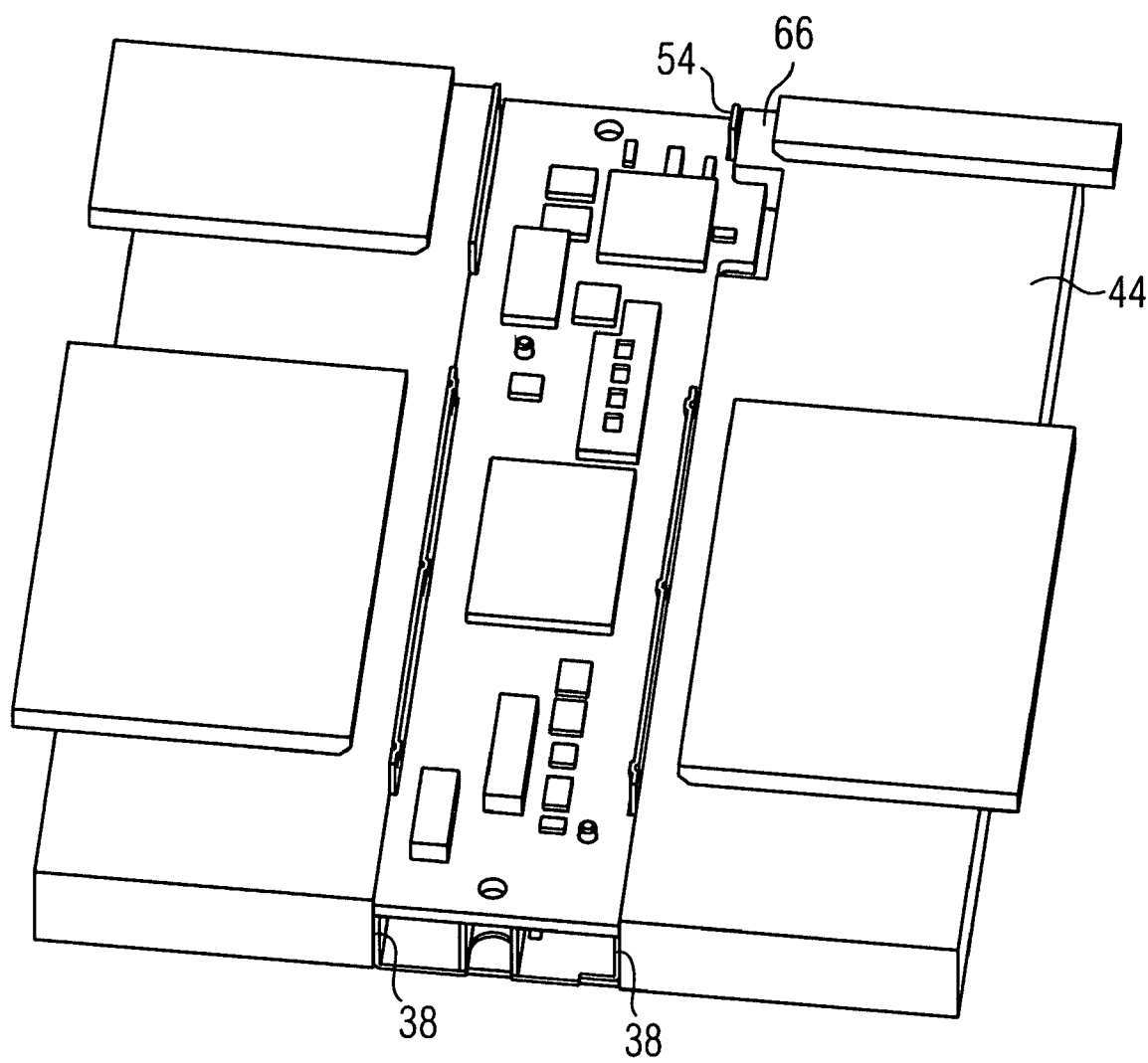
FIG. 4 depicts a second of the method steps of FIG. 2.
Figure 5:
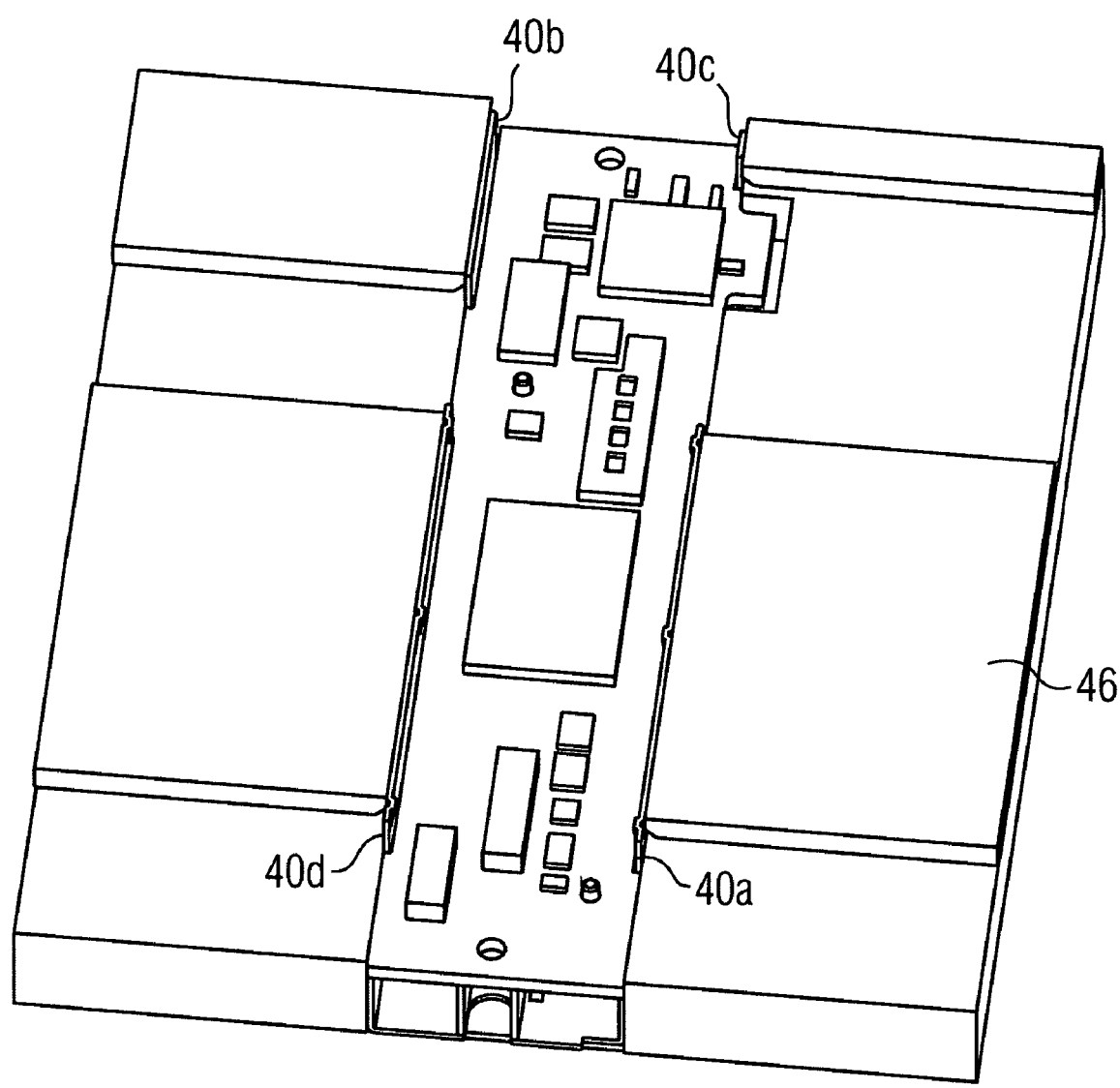
FIG. 5 depicts a third of the method steps of FIG. 2.
Figure 6:
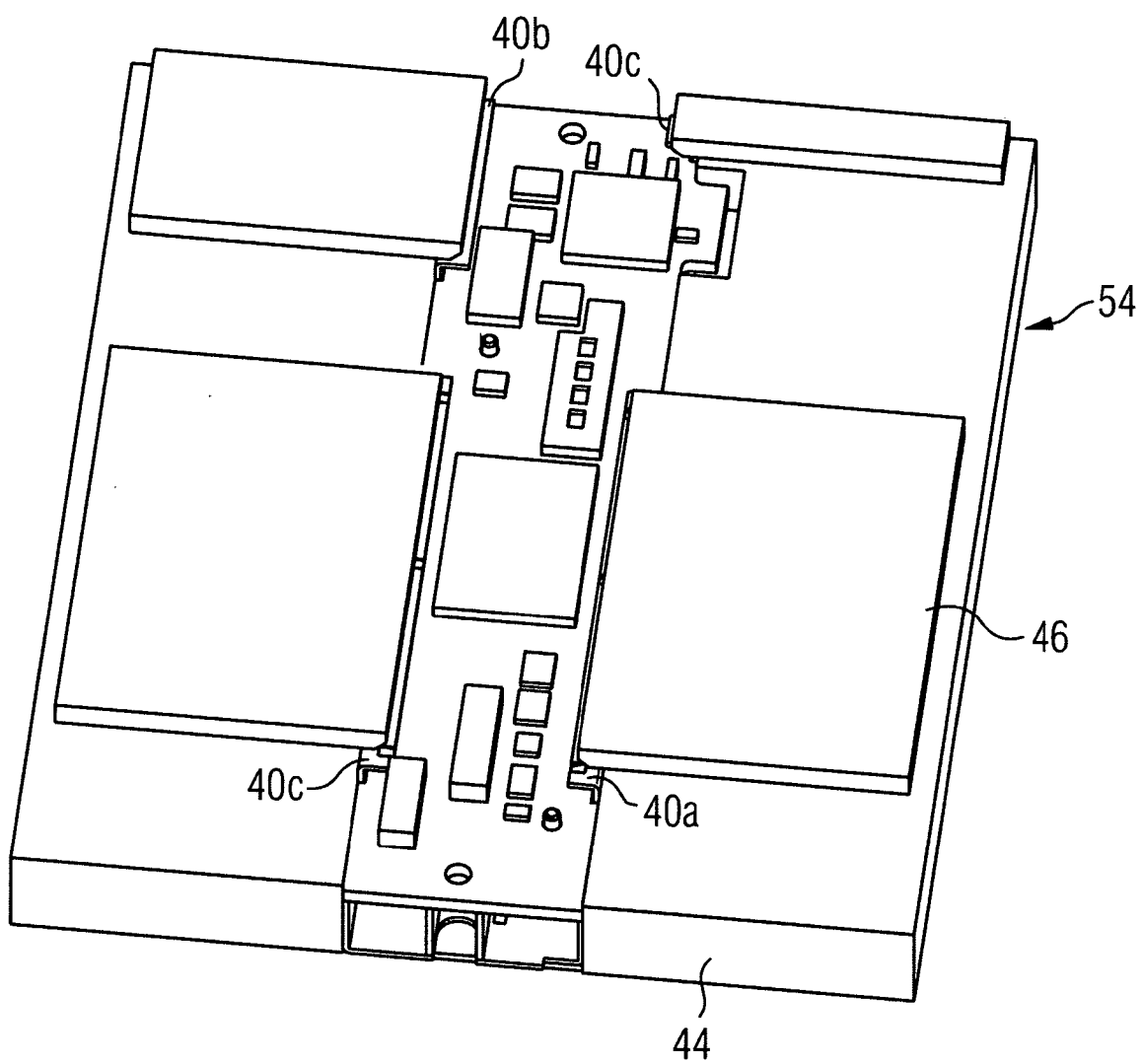
FIG. 6 depicts a fourth of the method steps of FIG. 2.
Figure 7:
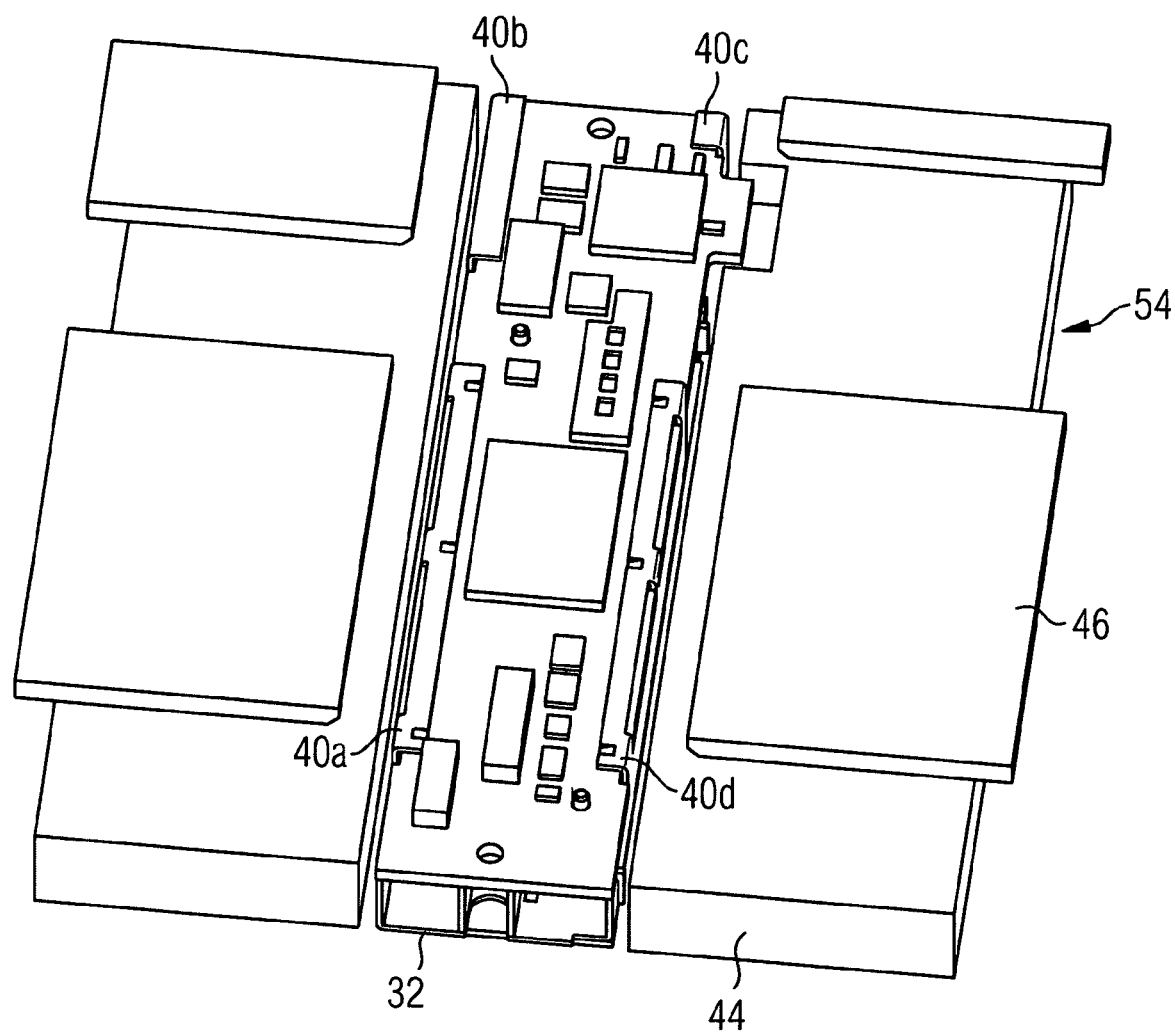
FIG. 7 depicts a fifth of the method steps of FIG. 2.
Figure 8:
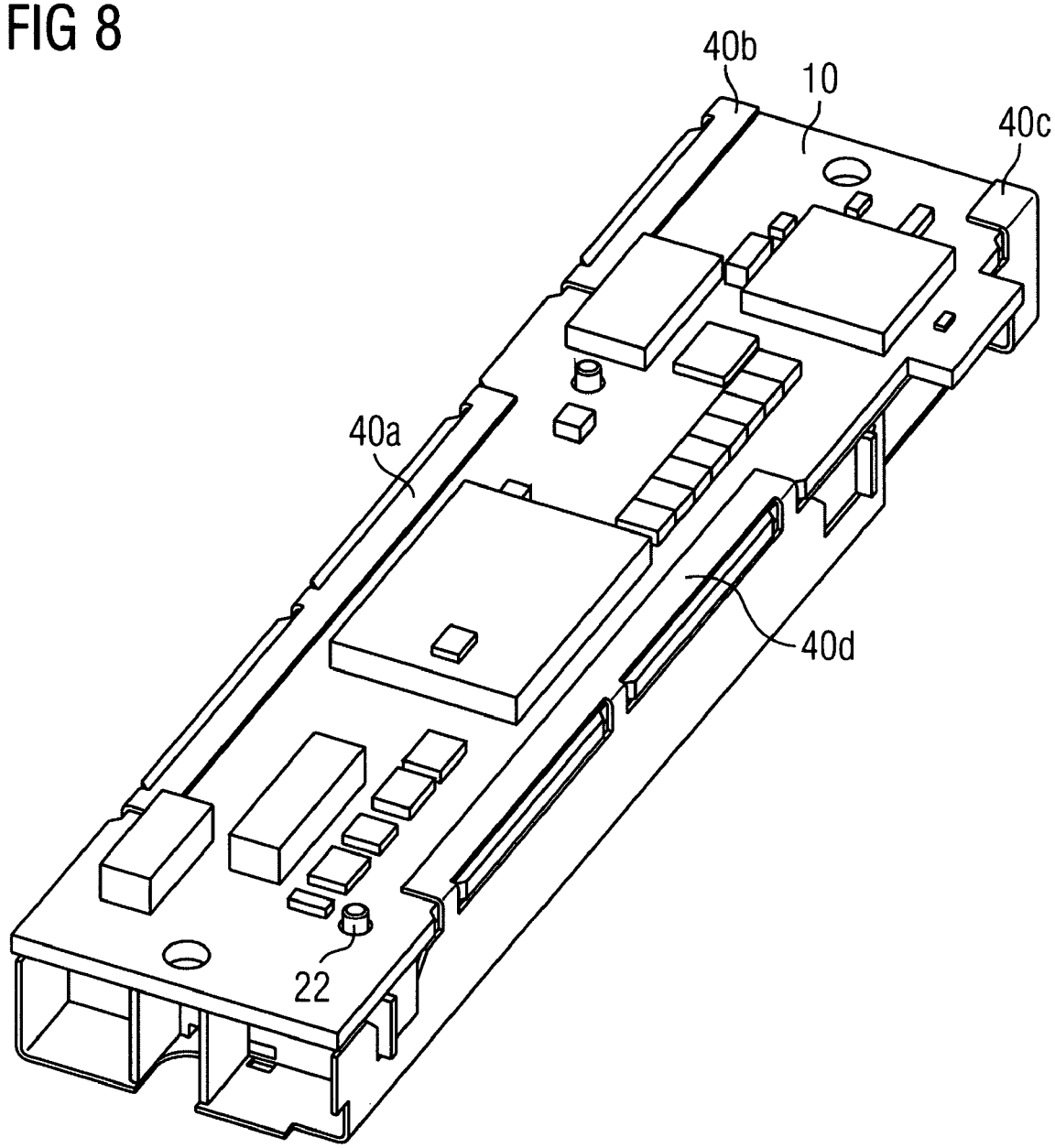
FIG. 8 depicts a view of the first assembly.

FIG. 4 depicts the engaging of side walls 38 by first holding members 44. Side protrusion 54 is now engaged by mating means 66. FIG. 5 depicts the second holding members 46 engaging flanges 40. FIG. 6 depicts the flanges 40 being bent over PCB in a direction towards one another. FIG. 7 depicts the first and second engaging means moving away from cap 32, the flanges 40 now bent into place over PCB. FIG. 8 depicts an orthogonal view of the final product with flanges 40 bent into place. The apparatus is now held together by the cooperation of bent flanges and spacers. No mechanical fastening means such as screws and bolts are required. Accordingly, the problems of damage to interior components by rigid legs extending from the PCB, along with the potential for damage when attaching the legs to the PCB are obviated. Accordingly, more room within cap 32 may be utilized for components and the like. An additional advantage lay in the cooperation of the cap and spacers providing force and environmental protection for components and the like accommodated within the cap.

I claim:

1. A method for forming an electronic assembly in a housing, said housing comprising a base, a top, a pair of opposing side walls located on opposing sides of said base and top, said walls connected to said base, each side wall having a top end portion located above said top in a direction away from said base, and said assembly comprising a frame positioned between said base and said top, comprising the steps of:
   assembling a plurality of spacers in said housing running between said base and said top proximate said opposing side walls,
   applying a downward pressure on said top to force the top against the spacers,
   bending top end portions of said opposing side walls about said sides of said top to form bent top end portions such that said top is positioned between said bent top end portions and said spacers, and
   releasing said downward pressure on said top to cause said spacers to apply pressure against said top to force said top against said bent top end portions of said opposing side walls.

2. The method according to claim 1, wherein said housing further comprises an electronic component positioned between said top and said base.

3. The method according to claim 1, wherein said step of bending further comprises the step of supporting said side walls from outside said housing such that said bend pressure is applied primarily to said top end portions to form said bent top portions.

4. The method according to claim 1, wherein said step of supporting is performed before said step of bending.

5. The method according to claim 1, wherein said top comprises a printed circuit board and said electronic element comprises a liquid crystal display.

6. The method according to claim 1, wherein said spacers comprise rubber.

7. An electronic apparatus housing comprising:
   a base,
   a top,
   a pair of opposing side walls located on opposing sides of said base and top, each of said walls connected to said base and having a bent top end portion located above said top in a direction away from said base and bent about a respective one of the opposing sides of said top,
   a frame positioned between said base and said top, whereby said bent top end portions extend from said opposing side walls at said opposing sides of said top towards one another over said top, and said top is held in a fixed position against said bent top end portions by pressure applied by said spacers.

8. The housing according to claim 7, further comprising an electronic component positioned between said frame and said base.

9. The housing according to claim 7, wherein said top comprises a printed circuit board and said electronic component comprises a liquid crystal display.

10. The housing according to claim 7, wherein said spacers comprise rubber.

* * * * *